(12) United States Patent
Kakumu et al.

(10) Patent No.: US 12,362,005 B2
(45) Date of Patent: Jul. 15, 2025

(54) SEMICONDUCTOR MEMORY DEVICE

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 140 days.

(21) Appl. No.: 18/331,328

(22) Filed: Jun. 8, 2023

(65) Prior Publication Data
US 2023/0402089 A1    Dec. 14, 2023

(30) Foreign Application Priority Data

Jun. 10, 2022   (WO) .................. PCT/JP2022/023426

(51) Int. Cl.
*G11C 7/22*    (2006.01)
*G11C 11/4096*    (2006.01)
(Continued)

(52) U.S. Cl.
CPC .......... *G11C 11/4096* (2013.01); *H10B 12/20* (2023.02); *H10D 30/6735* (2025.01)

(58) Field of Classification Search
CPC ................ G11C 11/4096; H10B 12/20; H10B 29/42392
(Continued)

(56) References Cited

U.S. PATENT DOCUMENTS 11,682,443 B2 *  6/2023  Sakui ................ G11C 14/0018
                                                    365/184
11,776,609 B2 * 10/2023  Harada ............. H01L 29/66666
                                                    365/149
(Continued)

FOREIGN PATENT DOCUMENTS

JP          H02-188966 A      7/1990
JP          2003-188279 A     7/2003
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (Mar. 1991).

(Continued)

*Primary Examiner* — Viet Q Nguyen
(74) *Attorney, Agent, or Firm* — Crowell & Moring LLP (57) ABSTRACT

A dynamic flash memory includes a p layer as a semiconductor base material; first and second n⁺ layers extending on opposite sides thereof; a first gate insulating layer partially covering the p layer; a first gate conductor layer provided thereon; a second gate insulating layer provided in contact with the first gate insulating layer and partially covering the p layer; and a second gate conductor layer provided on the second gate insulating layer and electrically isolated from the first gate conductor layer. The first and second n⁺ layers, and the first and second gate conductor layers are respectively connected to a source line, a bit line, a word line, and a plate line. A voltage applied to each terminal during memory erasing is always greater than or equal to 0 V such that 2 V and 0.6 V are respectively applied to the plate line and the bit line.

8 Claims, 8 Drawing Sheets

(51) Int. Cl.
  *H10B 12/00* (2023.01)
  *H10D 30/67* (2025.01)
(58) Field of Classification Search
  USPC .................................................. 365/189.011
  See application file for complete search history.

(56) References Cited

U.S. PATENT DOCUMENTS

| | | | |
|---|---|---|---|
| 11,776,620 B2* | 10/2023 | Sakui | G11C 11/4076 365/189.011 |
| 11,823,726 B2* | 11/2023 | Sakui | G11C 16/0466 |
| 11,823,727 B2* | 11/2023 | Sakui | G11C 16/14 |
| 11,915,757 B2* | 2/2024 | Sakui | G11C 16/02 |
| 11,917,807 B2* | 2/2024 | Sakui | G11C 5/063 |
| 11,925,013 B2* | 3/2024 | Harada | G11C 11/4094 |
| 11,968,822 B2* | 4/2024 | Harada | G11C 11/4096 |
| 12,048,140 B2* | 7/2024 | Sakui | G11C 16/26 |
| 12,096,611 B2* | 9/2024 | Sakui | G11C 11/4097 |
| 12,100,443 B2* | 9/2024 | Sakui | G11C 16/24 |
| 12,120,864 B2* | 10/2024 | Sakui | G11C 11/4096 |
| 12,131,773 B2* | 10/2024 | Sakui | G11C 16/10 |
| 12,159,923 B2* | 12/2024 | Harada | H01L 29/78642 |
| 2003/0111681 A1 | 6/2003 | Kawanaka | |
| 2006/0157738 A1 | 7/2006 | Kawanaka | |
| 2008/0137394 A1 | 6/2008 | Shimano et al. | |
| 2008/0205133 A1 | 8/2008 | Gonzalez et al. | |
| 2020/0135863 A1 | 4/2020 | Han et al. | |
| 2022/0320097 A1* | 10/2022 | Harada | H10B 12/20 |
| 2022/0344336 A1* | 10/2022 | Sakui | H10B 12/05 |
| 2022/0359521 A1* | 11/2022 | Sakui | H10B 12/036 |
| 2022/0367473 A1* | 11/2022 | Sakui | G11C 11/406 |
| 2022/0367680 A1* | 11/2022 | Sakui | H01L 27/1203 |
| 2022/0392900 A1* | 12/2022 | Harada | H10B 12/036 |
| 2022/0406781 A1* | 12/2022 | Sakui | G11C 11/406 |
| 2023/0115460 A1* | 4/2023 | Sakui | G11C 11/4096 365/184 |
| 2023/0301057 A1* | 9/2023 | Harada | H01L 29/7841 |
| 2023/0402089 A1* | 12/2023 | Kakumu | G11C 11/4096 |
| 2024/0074140 A1* | 2/2024 | Kakumu | G11C 11/404 |

FOREIGN PATENT DOCUMENTS

| | | |
|---|---|---|
| JP | 2008-147514 A | 6/2008 |
| JP | 2010-519770 A | 6/2010 |
| JP | 7057032 B1 | 4/2022 |
| JP | 7057037 B1 | 4/2022 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 Dram Cell with Vertical Pillar Transistor(VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007), pp 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp. 1-9 (Jun. 2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (May 2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI FinFETs," Semicond. Sci. Technol. 29 (2014) 115021 (7pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI,"IEICE Trans. Electron., vol. E90-c., No.4 pp.765-771 (2007).

Takashi Ohasawa and Takeshi Hamamoto, "Floating Body Cell—a Novel Body Capacitorless DRAM Cell", Pan Stanford Publishing (2011).

K.Sakui, N. Harada,"Dynamic Flash Memory with Dual Gate Surrounding Gate Transistor (SGT),"Proc. IEEE IMW, pp. 72-75(2021).

IPER in Application No. PCT/JP2022/023426, dated Apr. 4, 2023. International Preliminary Report on Patentability in International Application No. PCT/JP2022/023426, dated Dec. 12, 2024 (5 pages).

* cited by examiner

SEMICONDUCTOR MEMORY DEVICE

CROSS REFERENCE TO RELATED APPLICATIONS

This application claims priority to PCT/JP2022/023426, filed Jun. 10, 2022, the entire content of which is incorporated herein by reference.

BACKGROUND OF THE INVENTION

Field of the Invention

The present invention relates to a semiconductor memory device.

Description of the Related Art

In recent years, there has been a demand for a higher degree of integration, higher performance, lower power consumption, and higher functionality of memory elements in the development of the LSI (Large Scale Integration) technology.

Memory elements have been developed with the aim of increasing density and performance. Using SGTs (Surrounding Gate Transistors; see Japanese Patent Laid-Open No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)) as selection transistors can provide, for example, a DRAM (Dynamic Random Access Memory) with a capacitor connected thereto (for example, see H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)), a PCM (Phase Change Memory) with a variable resistance element connected thereto (for example, see H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)), a RRAM (Resistive Random Access Memory; for example, see T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V," IEDM (2007)), and a MRAM (Magneto-resistive Random Access Memory) whose resistance is changed by changing the direction of a magnetic spin using a current (for example, see W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)).

There is also known a capacitorless DRAM memory cell including a single MOS transistor (see M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010), J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012), Takashi Ohasawa and Takeshi Hamamoto, "Floating Body Cell-a Novel Body Capacitorless DRAM Cell", Pan Stanford Publishing (2011), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006), and E. Yoshida: "A Capacitorless 1T-DRAM Technology Using Gate-Induced Drain-Leakage (GIDL) Current for Low-Power and High-Speed Embedded Memory," IEEE IEDM (2006)), for example. For example, logical memory data "1" is written by retaining in a channel of an N-channel MOS transistor some or all of holes among the holes and electrons generated in the channel through an impact ionization phenomenon based on a source-drain current. Meanwhile, logical memory data "0" is written by removing the holes from the channel. In such a memory cell, it is desired to improve a decrease in the operation margin due to fluctuation of a voltage in the channel with a floating body structure, and also improve degradation of the data retention characteristics resulting from the removal of some of the holes that are the charge carriers stored in the channel.

There is also known a twin-transistor-based MOS transistor memory element obtained by forming a single memory cell in an SOI layer using two MOS transistors (for example, see US2008/0137394 A1, US2003/0111681 A1, and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., Vol. E90-c., No. 4 pp. 765-771 (2007)). For such elements, an $N^+$ layer to serve as the sources or drains, which separates the respective channels with a floating body structure of the two MOS transistors, is formed in contact with an insulating layer provided on the side of a substrate. In such a memory cell also, holes that are charge carriers are stored in the channel of a single MOS transistor. Thus, it is desired to improve a decrease in the operation margin, or improve degradation of the data retention characteristics resulting from the removal of some of the holes that are the charge carriers stored in the channel as with the foregoing memory cell including a single MOS transistor.

Figure 4A:
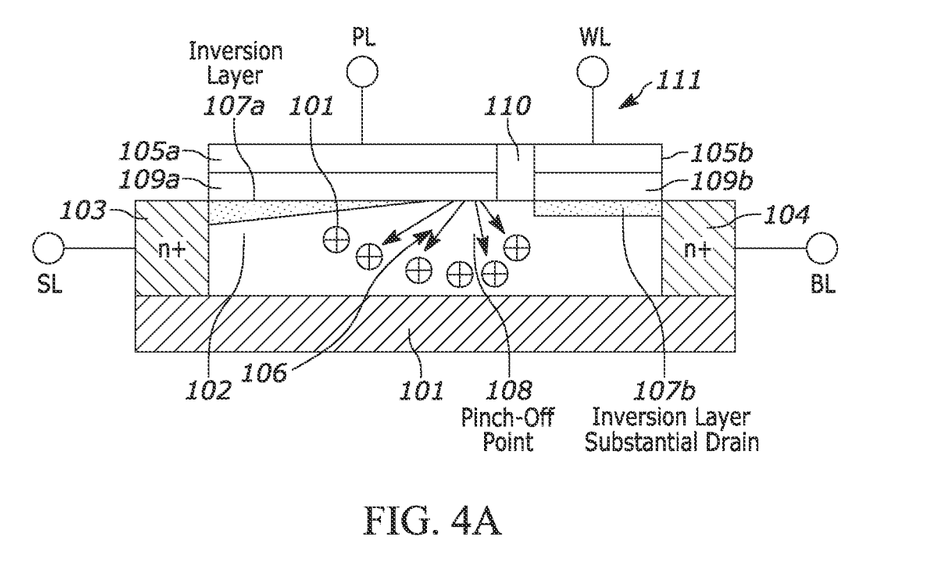
FIGS. 4A, 4B, 4C and 4D are views each illustrating the cross-sectional structure and the operation of a conventional dynamic flash memory device.

There is also known a capacitorless memory including MOS transistors as illustrated in FIGS. 4A to 4D (see US2008/0137394 A1 and K. Sakui, N. Harada, "Dynamic Flash Memory with Dual Gate Surrounding Gate Transistor (SGT)," Proc. IEEE IMW, pp. 72-75 (2021)). As illustrated in FIG. 4A, a semiconductor base material 102 with a floating body structure is provided on a $SiO_2$ layer 101 of a SOI substrate. An $n^+$ layer 103 connecting to a source line SL and an $n^+$ layer 104 connecting to a bit line BL are provided at opposite ends of the semiconductor base material 102 with the floating body structure. In addition, a first gate insulating layer 109a connecting to the $n^+$ layer 103 and covering the semiconductor base material 102 with the floating body structure, and a second gate insulating layer 109b connecting to the $n^+$ layer 104 and covering the semiconductor base material 102 with the floating body structure are provided. Further, a first gate conductor layer 105a covering the first gate insulating layer 109a and connecting to a plate line PL, and a second gate conductor layer 105b covering the second gate insulating layer 109b and connecting to a word line WL are provided. An insulating layer 110 is provided between the first gate conductor layer 105a and the second gate conductor layer 105b. Accordingly, a DFM memory cell 111 is formed. It should be noted that the source line SL may connect to the $n^+$ layer 104, and the bit line BL may connect to the $n^+$ layer 103.

Figure 4B:
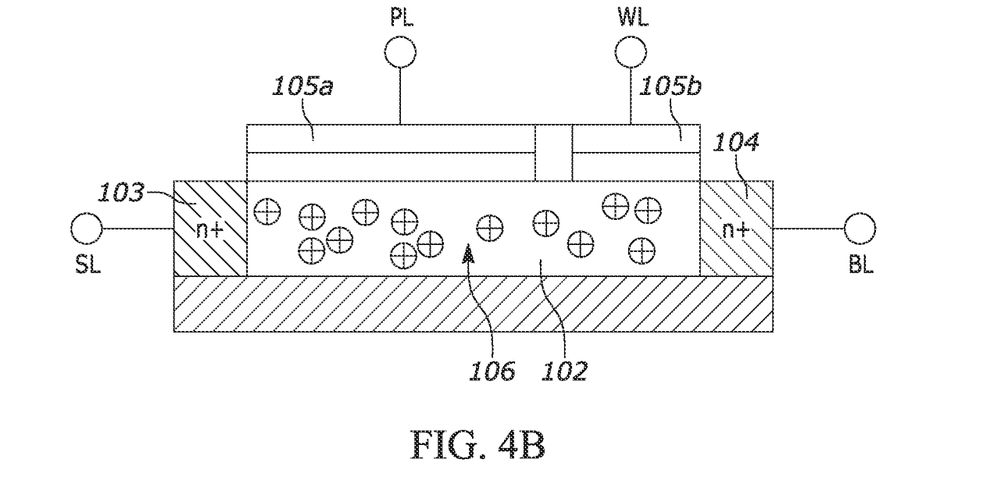

As illustrated in FIG. 4A, for example, a voltage of 0 V is applied to the n$^+$ layer 103 and a positive voltage is applied to the n$^+$ layer 104 so that a first N-channel MOS transistor region, which includes the semiconductor base material 102 with the floating body structure surrounded by the first gate conductor layer 105a, is operated in the saturation region, while a second N-channel MOS transistor region, which includes the semiconductor base material 102 with the floating body structure surrounded by the second gate conductor layer 105b, is operated in the linear region. Consequently, the second N-channel MOS transistor region has no pinch-off point, and an inversion layer 107b is formed on the entire surface in contact with the second gate insulating layer 109b. The inversion layer 107b formed below the second gate conductor layer 105b connecting to the word line WL functions as a substantial drain of the first N-channel MOS transistor region. Consequently, an electric field in the boundary region of the channel region between the first N-channel MOS transistor region and the second N-channel MOS transistor region becomes maximum, and an impact ionization phenomenon occurs in the region. Then, as illustrated in FIG. 4B, a memory write operation is performed by removing electrons, among the electrons and holes generated through the impact ionization phenomenon, from the semiconductor base material 102 with the floating body structure, and retaining some or all of holes 106 in the semiconductor base material 102 with the floating body structure.

Figure 4C:
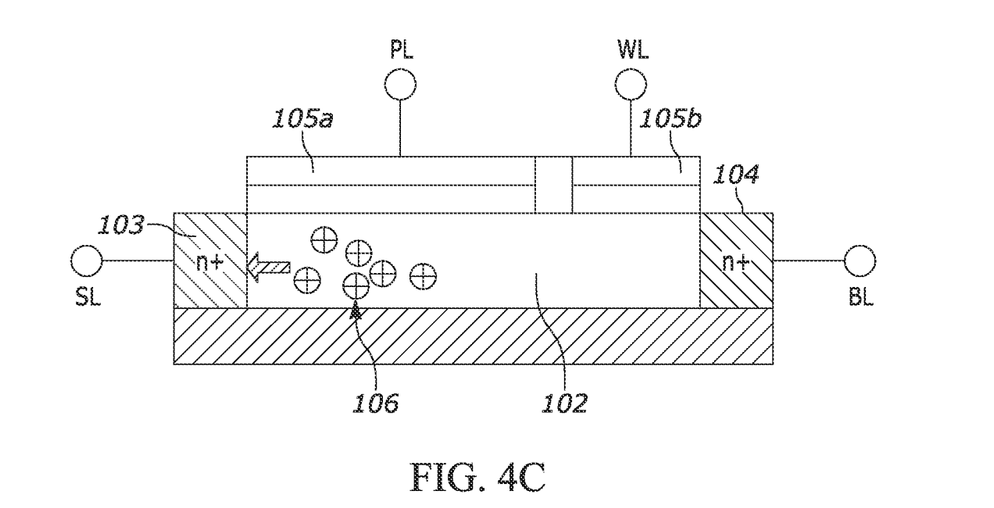
Figure 4D:
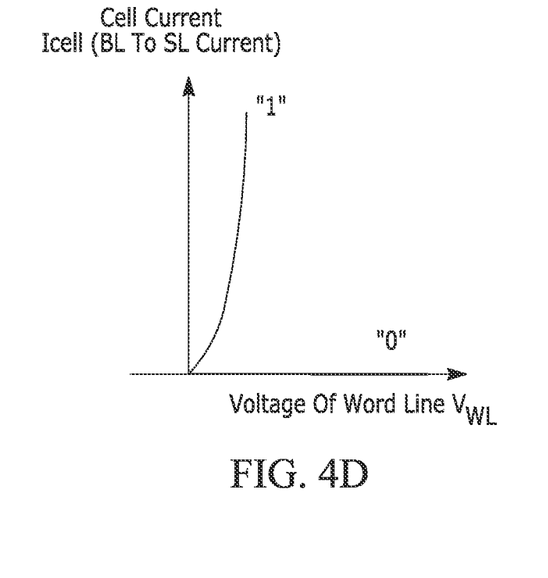

Then, as illustrated in FIG. 4C, for example, an erase operation is performed by applying a positive voltage to the plate line PL, a voltage of 0 V to each of the word line WL and the bit line BL, and a negative voltage to the source line SL, thereby removing the holes 106 from the semiconductor base material 102 with the floating body structure. Such a state corresponds to logical memory data "0." Then, in reading data, setting the voltage applied to the first gate conductor layer 105a connecting to the plate line PL to be higher than the threshold voltage corresponding to the logical memory data "1" and lower than the threshold voltage corresponding to the logical memory data "0" can obtain such characteristics that no current flows even when the voltage of the word line WL is set high for reading the logical memory data "0" as illustrated in FIG. 4D. With such characteristics, the operation margin can be significantly increased in comparison with those of the foregoing memory cells. In such a memory cell, since the channels of the first N-channel MOS transistor region, which has the first gate conductor layer 105a connecting to the plate line PL as the gate, and the second N-channel MOS transistor region, which has the second gate conductor layer 105b connecting to the word line WL as the gate, are continuous in the semiconductor base material 102 with the floating body structure, it is possible to greatly suppress fluctuation of a voltage in the semiconductor base material 102 with the floating body structure when a selection pulse voltage is applied to the word line WL. This greatly improves the problems of the foregoing memory cells, such as a decrease in the operation margin and degradation of the data retention characteristics resulting from the removal of some of the holes that are the charge carriers stored in the channel. However, such memory elements are desired to have further improved characteristics.

An object of the present invention is to provide a stable method for erasing memory information from a dynamic flash memory that is a memory device.

SUMMARY OF THE INVENTION

To achieve the foregoing object, a memory device with semiconductor elements according to the present invention includes a semiconductor base material extending on a substrate in a horizontal direction or a vertical direction; a first impurity region and a second impurity region that are continuous with respective opposite ends of the semiconductor base material; a first gate insulating layer partially covering the semiconductor base material; a first gate conductor layer covering the first gate insulating layer; a second gate insulating layer continuous with the first gate insulating layer and partially covering the semiconductor base material; and a second gate conductor layer not in contact with the first gate conductor layer, the second gate conductor layer covering the second gate insulating layer, in which a memory erase operation is performed by applying a voltage to allow a potential difference to be generated between the first impurity region and the second impurity region, and applying to one of the first gate conductor layer and the second gate conductor layer a first voltage in a range of 0 V to a threshold voltage, and also applying to another of the first gate conductor layer and the second gate conductor layer a second voltage having the same polarity as a polarity of the first voltage and having an absolute value greater than or equal to an absolute value of the threshold voltage, thereby reducing holes or electrons that are majority carriers remaining in the semiconductor base material (first invention).

In the foregoing first invention, the first impurity region is connected to a source line, the second impurity region is connected to a bit line, one of the first gate conductor layer and the second gate conductor layer is connected to a word line, and another of the first gate conductor layer and the second gate conductor layer is connected to a plate line, and an operation of a dynamic flash memory is performed by applying a voltage to each of the source line, the bit line, the plate line, and the word line to execute a memory write operation, a memory read operation, or the memory erase operation (second invention).

In the foregoing second invention, in the erase operation for the dynamic flash memory, when majority carriers in the semiconductor base material are holes, a voltage of 0 V or a positive potential is applied to the first impurity region, the second impurity region, the first gate conductor layer, and the second gate conductor layer (third invention).

In the foregoing second invention, in the erase operation for the dynamic flash memory, when majority carriers in the semiconductor base material are electrons, a voltage of 0 V or a negative potential is applied to the first impurity region, the second impurity region, the first gate conductor layer, and the second gate conductor layer (fourth invention).

In the foregoing second invention, in the memory erase operation for the dynamic flash memory, one of the source line and the bit line is at 0 V (fifth invention).

In the foregoing second invention, the memory write operation for the dynamic flash memory includes applying to the word line a voltage having an absolute value that is greater than or equal to an absolute value of a threshold voltage of a first MOS transistor region including the first gate insulating layer and the first gate conductor layer, and having the same polarity as a polarity of the threshold voltage, applying to the plate line a voltage having an absolute value that is greater than or equal to an absolute value of a threshold voltage of a second MOS transistor region including the second gate insulating layer and the second gate conductor layer, and having the same polarity as a polarity of the threshold voltage, applying to the bit line a voltage that allows a maximum electric field in the semiconductor base material to cause impact ionization during writing, applying 0 V to the source line, thereby causing an impact ionization phenomenon based on a current flowed between the first impurity region and the second impurity region, and thus generating electrons and holes in the semiconductor base material and the first impurity region, and allowing, among the generated electrons and holes, some or all of the electrons or the holes that are majority carriers in the semiconductor base material to remain in the semiconductor base material (sixth invention).

In the foregoing second invention, an absolute value of a current flowing through the bit line during the memory erase operation for the dynamic flash memory is lower than an absolute value of a current flowing through the bit line during the memory write operation for the dynamic flash memory (seventh invention).

In the foregoing second invention, the voltages applied to the plate line, the word line, the source line, and the bit line during the memory write operation and the memory erase operation for the dynamic flash memory are 0 V or voltages having the same polarity (eighth invention).

BRIEF DESCRIPTION OF THE DRAWINGS

FIGS. 1AA, 1AB, 1AC and 1AD are views each illustrating a cross-sectional structure of a memory device with semiconductor elements according to a first embodiment;

FIGS. 1BE and 1BF are views each illustrating a cross-sectional structure of the memory device with the semiconductor elements according to the first embodiment;

DETAILED DESCRIPTION OF THE PREFERRED EMBODIMENTS

Hereinafter, the structure of a memory device with semiconductor elements, a driving scheme therefor, and the behavior of carriers stored therein according to an embodiment of the present invention will be described with reference to the drawings.

First Embodiment

The structure and the operation mechanism of a memory cell with semiconductor elements according to a first embodiment of the present invention will be described with reference to FIGS. 1AA to 3B (hereinafter, FIGS. 1AA to 1BF shall also be collectively referred to as FIG. 1). First, the structure of the memory cell with the semiconductor elements according to the present embodiment will be described with reference to FIG. 1. Next, the mechanism of writing data to the memory cell with the semiconductor elements, and the behavior of carriers therein will be described with reference to FIGS. 2A to 2C. Then, the mechanism of erasing data will be described with reference to FIGS. 3A and 3B.

Figure 1:
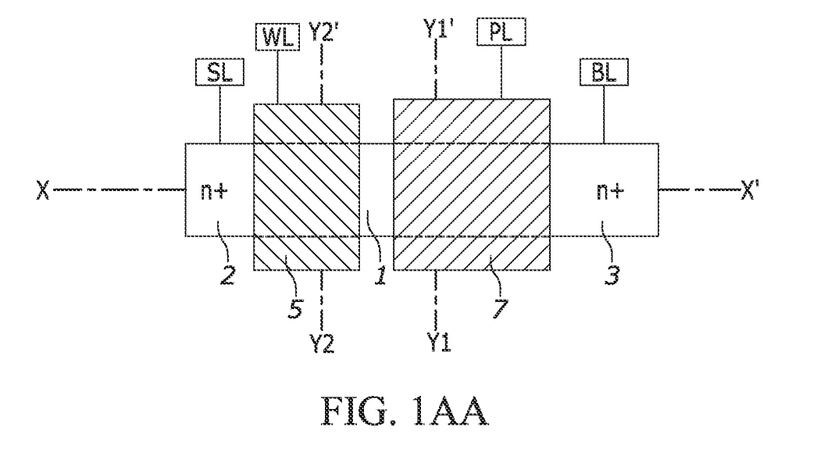

FIG. 1 illustrate the structure of the memory cell with the semiconductor elements according to the first embodiment of the present invention. FIG. 1AA is a plan view, and FIG. 1AB is a vertical cross-sectional view along line X-X' in FIG. 1AA. FIG. 1AC is a cross-sectional view along line Y1-Y1' in FIG. 1AA, and FIG. 1AD is also a cross-sectional view along line Y1-Y1' in FIG. 1AA as an additional example of FIG. 1AC. FIG. 1BE is a cross-sectional view along line Y2-Y2' in FIG. 1AA, and FIG. 1BF is also a cross-sectional view along line Y2-Y2' in FIG. 1AA as an additional example of FIG. 1BE. The structure in FIG. 1AC may be replaced with the structure in FIG. 1AD, and the structure in FIG. 1BE may be replaced with the structure in FIG. 1BF.

A p layer 1 that is a silicon semiconductor base material with p-type or i-type (intrinsic) conductivity containing acceptor impurities (which is an example of a "semiconductor base material" in the claims) is provided on a substrate 20 (which is an example of a "substrate" in the claims). An $n^+$ layer 2 (hereinafter, a semiconductor region containing a high concentration of donor impurities shall be referred to as an "$n^+$ layer") (which is an example of a "first impurity region" in the claims) is provided on one side of the p layer 1 in the horizontal direction. An $n^+$ layer 3 (which is an example of a "second impurity region" in the claims) is provided on the opposite side of the $n^+$ layer 2. A gate insulating layer 4 (which is an example of a "first gate insulating layer" in the claims) is provided in contact with or near the $n^+$ layer 2 so as to partially cover the surface of the p layer 1. A first gate conductor layer 5 (which is an example of a "first gate conductor layer" in the claims) is provided in proximity to the $n^+$ layer 2 so as to partially or entirely surround the gate insulating layer 4. A gate insulating layer 6 (which is an example of a "second gate insulating layer" in the claims) is formed in contact with or near the $n^+$ layer 3 so as to partially cover the surface of the p layer 1. A second gate conductor layer 7 (which is an example of a "second gate conductor layer" in the claims) is provided not in contact with the first gate conductor layer 5 but in proximity to the $n^+$ layer 3 so as to partially or entirely surround the gate insulating layer 6.

Accordingly, the p layer 1, the $n^+$ layer 2, the $n^+$ layer 3, the gate insulating layer 4, the first gate conductor layer 5, the gate insulating layer 6, and the second gate conductor layer 7 form a single dynamic flash memory cell.

Further, the $n^+$ layer 2 is connected to a source line SL (which is an example of a "source line" in the claims) as a wire conductor, the first gate conductor layer 5 is connected to a word line WL (which is an example of a "word line" in the claims) as a wire conductor, and the second gate conductor layer 7 is connected to a plate line PL (which is an example of a "plate line" in the claims) as a wire conductor. The $n^+$ layer 3 is connected to a bit line BL (which is an example of a "bit line" in the claims) as a wire conductor. The dynamic flash memory operation is performed by controlling a potential of each of the source line, the bit line, the plate line, and the word line. In the memory device of the present embodiment, the foregoing plurality of dynamic flash memory cells are arranged two-dimensionally or three-dimensionally.

It should be noted that the dynamic flash memory may also be constructed with a structure in which each of the second gate conductor layer 7 and the gate insulating layer 6 is split into two layers on the top and bottom sides of the p layer 1 so as to partially surround the p layer 1 as in FIG. 1AD. In addition, the dynamic flash memory may also be constructed with a structure in which each of the first gate conductor layer 5 and the gate insulating layer 4 is split into two layers on the top and bottom sides of the p layer 1 so as to partially surround the p layer 1 as in FIG. 1BF.

For each of the gate insulating layers 4 and 6, any insulating film used in the common MOS process can be used, such as a $SiO_2$ film, a SiON film, a HfSiON film, or a stacked film of $SiO_2$/SiN, for example.

Although the p layer 1 is a p-type semiconductor in FIG. 1, the concentration of the impurities therein may have a profile. In addition, the concentration of the impurities in each of the $n^+$ layer 2 and the $n^+$ layer 3 may also have a profile. A LDD (Lightly Doped Drain) may also be provided between the p layer 1 and each of the $n^+$ layers 2 and 3.

When each of the $n^+$ layer 2 and the $n^+$ layer 3 is formed using a $p^+$ layer containing holes as the majority carriers (hereinafter, a semiconductor region containing a high concentration of acceptor impurities shall be referred to as a "$p^+$ layer"), forming the p layer 1 using an n-type semiconductor can perform the dynamic flash memory operation by using electrons as the carriers for writing.

Each of the first gate conductor layer 5 and the second gate conductor layer 7 may be formed using metal or metal nitride, such as W, Pd, Ru, Al, TiN, TaN, or WN; an alloy (including silicide) thereof, such as a stacked structure of TiN/W/TaN; or a heavily doped semiconductor as long as the first gate conductor layer 5 can change the potential of part of the memory cell via the gate insulating layer 4 and the second gate conductor layer 7 can change the potential of part of the memory cell via the gate insulating layer 6.

Although FIG. 1AA illustrates an example in which the memory cell has a rectangular vertical cross-section as seen in the direction parallel to the sheet surface, the vertical cross-section may be trapezoidal or polygonal, or the memory cell may have a cylindrical shape.

Although FIG. 1AD illustrates an example in which the second gate conductor layer 7 is provided at two portions, that is, on both the top and bottom sides of the p layer 1, the dynamic flash memory operation may also be performed when the second gate conductor layer 7 is provided on one side. This is also true of the first gate conductor layer 5.

Although FIG. 1 illustrate the memory cell in which each of the first gate conductor layer 5 and the second gate conductor layer 7 is an integral body, it may be formed of a conductor layer split in the horizontal direction or the vertical direction. The foregoing dynamic flash memory operation may also be performed when the first gate conductor layer 5 is split into two layers, and one of the resulting layers is provided adjacent to the $n^+$ layer 2 while the other layer is provided adjacent to the $n^+$ layer 3 connected to the bit line BL across the second gate conductor layer 7. This point about the first gate conductor layer 5 is also true of the second gate conductor layer 7. In addition, the first gate conductor layer 5 and the second gate conductor layer 7 may be formed using layers of different conductor materials. Further, the gate insulating layer 4 and the gate insulating layer 6 may be formed using layers of different insulating materials.

The behavior of carriers, the storage of the carriers, and a cell current during a write operation for the dynamic flash memory according to the first embodiment of the present invention will be described with reference to FIGS. 2A to 2C. It should be noted that a first MOS transistor region having the first gate conductor layer 5 as the gate is indicated as a WL-FET (i.e., a field-effect MOS transistor region connecting to the word line WL), and a second MOS transistor region having the second gate conductor layer 7 as the gate is indicated as a PL-FET (i.e., a field-effect MOS transistor region connecting to the plate line PL). The threshold voltage of the WL-FET is indicated as Vth-WL, and the threshold voltage of the PL-FET is indicated as Vth-PL.

Figure 2A:
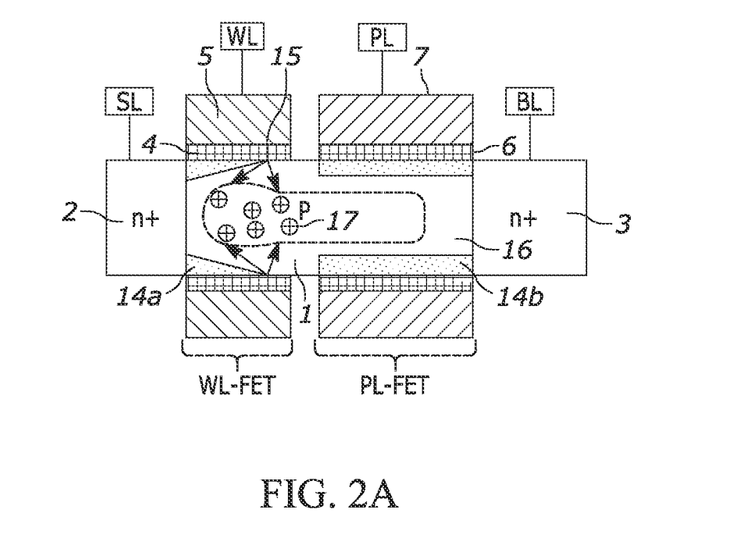
FIGS. 2A, 2B and 2C are views for describing the storage of hole carriers and a cell current during a write operation for the memory device with the semiconductor elements according to the first embodiment.

As illustrated in FIG. 2A, first, a case will be described where the majority carriers in the $n^+$ layer 2 and the $n^+$ layer 3 are electrons, $n^+$ poly (hereinafter, poly Si containing a high concentration of donor impurities shall be referred to as "$n^+$ poly") is used for the first gate conductor layer 5 connecting to the word line WL and for the second gate conductor layer 7 connecting to the plate line PL, for example, and a p-type semiconductor is used for the p layer 1. To write data to the dynamic flash memory, it is necessary to cause sufficient impact ionization in the portion of the WL-FET or the PL-FET. The conditions of the voltages applied to the bit line BL, the source line SL, the word line WL, and the plate line PL to satisfy such a condition are such that a voltage corresponding to the voltage applied to the bit line that is higher than the higher voltage of the Vth-PL by 10% or more is applied to the plate line, for example, so that an inversion layer is formed on part of or the entirety of the interface between the second gate insulating layer 6 of the PL-FET and the p layer 1, and the potential of the bit line is transmitted to the entire channel of the PL-FET, and also, a voltage higher than the WL-Vth is applied to the word line to allow a current to flow from the bit line to the source line, for example. In addition, as the voltage applied to the bit line, it is necessary to apply a voltage that allows a maximum electric field for generating impact ionization to be greater than or equal to $10^5$ V/cm, for example.

Examples of the voltages applied to write data to the memory will be described below based on the foregoing description. Herein, when Vth-WL=Vth-PL=0.8 V, 0 V is input to the source line SL connected to the $n^+$ layer 2, for example, 1.0 V is input to the bit line BL connected to the $n^+$ layer 3, for example, 1.5 V is input to the plate line PL connected to the second gate conductor layer 7, for example, and 1.2 V is input to the first gate conductor layer 5 connected to the word line WL, for example.

In such a voltage applied state, an inversion layer 14b is formed on the entire surface immediately below the gate insulating layer 6. In addition, an inversion layer 14a is formed in part of a region immediately below the gate insulating layer 4. A pinch-off point 15 at which the inversion layer 14a disappears is present immediately below the gate insulating layer 4, and an electric field becomes maximum at the pinch-off point 15. In this example, the maximum electric field is about $4 \times 10^5$ V/cm. Then, electrons flow in the direction from the $n^+$ layer 2 to the $n^+$ layer 3. Consequently, an impact ionization phenomenon occurs in a region around the pinch-off point 15. Due to the impact ionization phenomenon, electrons accelerated toward the $n^+$ layer 3 connected to the bit line BL from the $n^+$ layer 2 connected to the source line SL collide with Si lattices, and electron-hole pairs are generated due to the kinetic energy. Some of the generated electrons flow into the first gate conductor layer 5, but most of them flow into the $n^+$ layer 3 connected to the bit line BL.

Figure 2B:
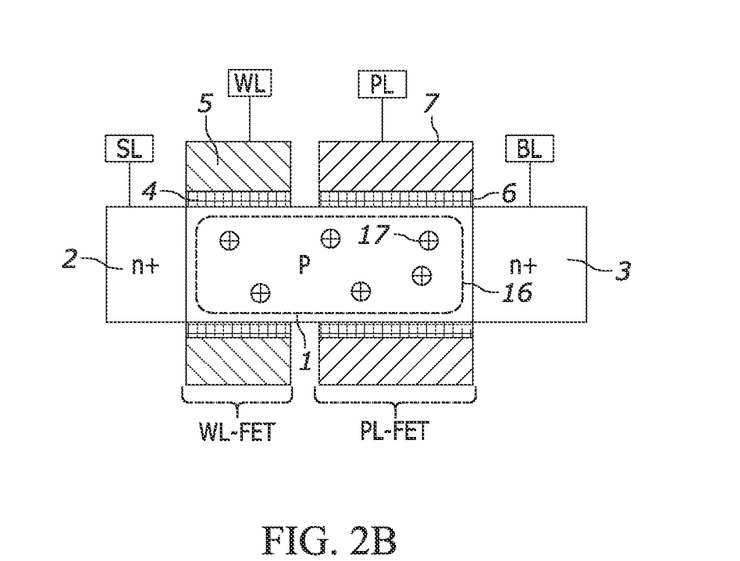
Figure 2C:
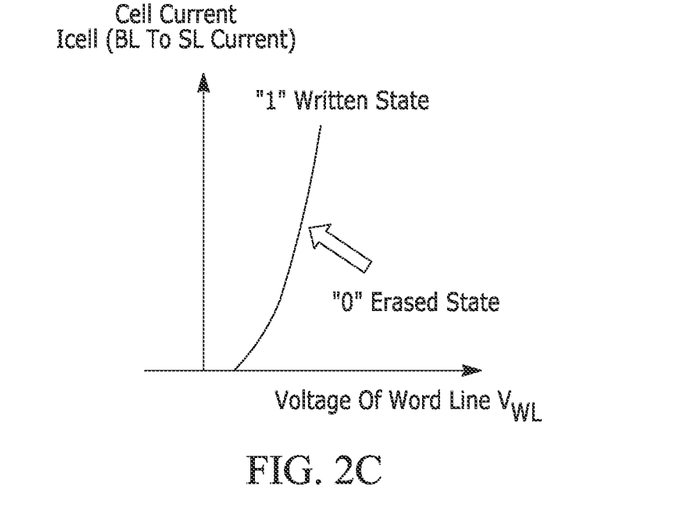

FIG. 2B illustrates holes 17 in the p layer 1 when all biases have become 0 V immediately after the writing. The generated holes 17 are the majority carriers in the p layer 1, and are temporarily stored in the p layer 1 surrounded by a depletion layer 16, and thus charge the p layer 1, which is substantially a substrate of the WL-FET and the PL-FET, in a positively biased manner in the non-equilibrium state. Consequently, each of the threshold voltage of the WL-FET including the first gate conductor layer 5 and the threshold voltage of the PL-FET including the second gate conductor layer 7 becomes lower than that in the initial state due to the positive substrate bias effect because of the holes temporarily stored in the p layer 1. When a voltage higher than such a lowered threshold voltage is applied to the PL, the PL-FET is turned on, and the WL-FET operates as a MOS transistor. Accordingly, as illustrated in FIG. 2C, in the WL-FET including the first gate conductor layer 5 connected to the word line WL, a current having dependence on the voltage of the WL flows from the $n^+$ layer 3 to the $n^+$ layer 2. Such a written state is allocated as logical memory data "1."

In addition to the foregoing example, the conditions of the voltages applied to the bit line BL, the source line SL, the word line WL, and the plate line PL may be other combinations, such as 1.0 V (BL)/0 V (SL)/2 V (PL)/2.0 V (WL), 1.5 V (BL)/0 V (SL)/3 V (PL)/1 V (WL), and 1.0 V (BL)/0 V (SL)/1.2 V (PL)/2.0 V (WL). However, when 1.0 V is applied to the bit line BL, 0 V is applied to the source line SL, 2 V is applied to the word line WL, 1.2 V is applied to the plate line PL, the position of the pinch-off point 15 is shifted toward the second gate conductor layer 7, but a similar phenomenon may be caused to occur.

Figure 3A:
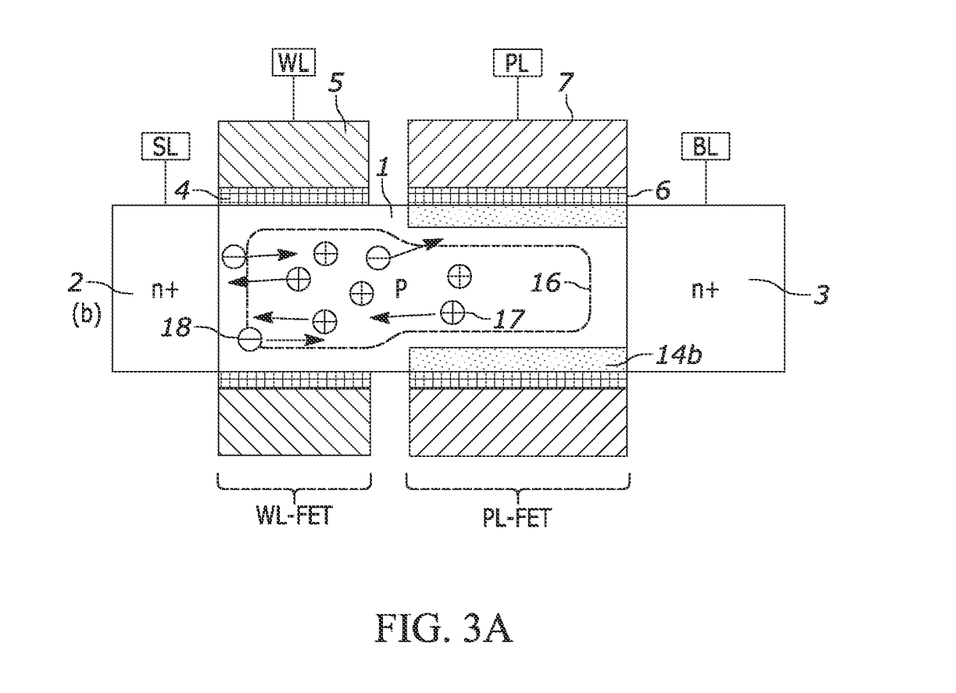
FIGS. 3A and 3B are views for describing an erase operation for the memory device with the semiconductor elements according to the first embodiment.
Figure 3B:
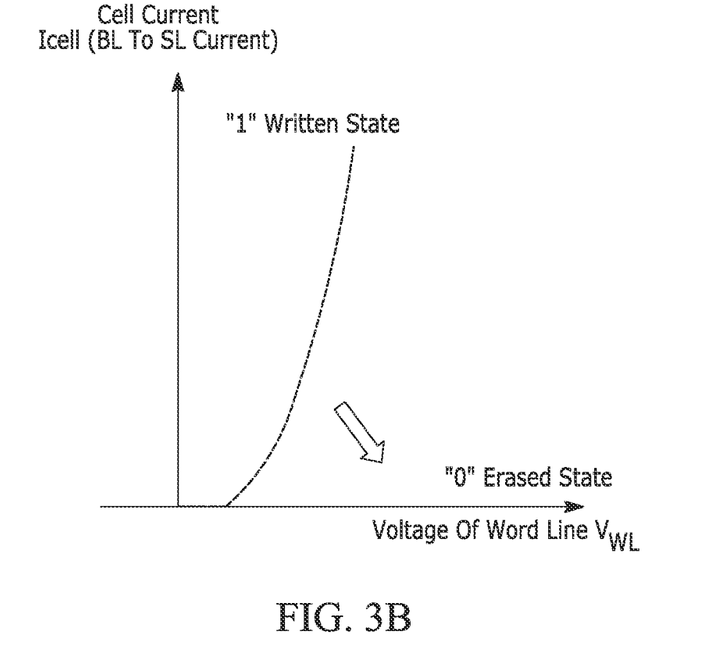

Next, the mechanism of an erase operation for the dynamic flash memory of the first embodiment will be described with reference to FIGS. 3A and 3B. To erase information from the dynamic flash memory, it is necessary that the stored holes recombine with electrons in a short time, and the electrons to recombine with the holes be supplemented from an electrode connecting to the memory. The conditions of the voltages applied to the bit line BL, the source line SL, the word line WL, and the plate line PL to satisfy such a condition are such that a voltage higher than the voltage of the Vth-PL is applied to the plate line to form an inversion layer on the entire surface immediately below the gate insulating layer 6, thereby forming the inversion layer 14b at the interface between the gate insulating layer 6 of the PL-FET and the p layer 1, and thus increasing the area in which the holes stored in the p layer 1 can recombine with electrons, and a voltage lower than the WL-Vth or 0 V is applied to the word line to form a depletion layer in the p layer 1 in the WL-FET. As the voltage applied to the bit line, it is possible to apply a voltage that allows electrons injected from the source line to move to the bit line by drifting, for example, a voltage that allows a maximum electric field of greater than or equal to $10^4$ V/cm to be applied.

An example of the erase operation for the dynamic flash memory of the first embodiment illustrated in FIG. 1 will be described with reference to FIGS. 3A and 3B. In the state illustrated in FIG. 2B, a voltage of 0.6 V is applied to the bit line BL, a voltage of 0 V is applied to the source line SL, a voltage of 2 V is applied to the plate line PL, and a voltage of 0 V is applied to the word line WL. Consequently, as the concentration of the holes 17 stored in the p layer 1 is sufficiently higher than the concentration of holes in the $n^+$ layer 2, the holes flow into the $n^+$ layer 2 due to diffusion because of the concentration gradient. Conversely, as the concentration of electrons in the $n^+$ layer 2 is higher than the concentration of electrons in the p layer 1, electrons 18 flow into the p layer 1 due to diffusion because of the concentration gradient. The electrons that have flowed into the p layer 1 recombine with the holes in the p layer 1, and thus disappear. However, not all of the injected electrons 18 disappear, and the electrons 18 that have not disappeared pass through the depletion layer 16 by drifting due to the potential gradient between the bit line BL and the source line SL, and then flow into the $n^+$ layer 3. Since the electrons are supplied from the source line SL one after another, the excess holes recombine with the electrons in quite a short time, and thus return to the initial state. The power consumed at this time is attributable to the electrons flowing from the source line SL, and thus is far lower than the power consumed during writing. Accordingly, as illustrated in FIG. 3B, each of the threshold voltage of the WL-FET including the first gate conductor layer 5 connected to the word line WL and the threshold voltage of the PL-FET including the second gate conductor layer 7 connected to the plate line PL returns to the original level. As illustrated in FIG. 3B, even when the voltage of the word line WL is set high, no current flows through the WL-FET including the first gate conductor layer 5 connected to the word line WL. Such an erase state of the memory element corresponds to logical memory data "0."

The reason why the power consumption during erasing is far lower than the power consumption of conventional capacitorless memory during writing is that the value of a current flowing between the bit line BL and the source line SL during erasing is lower than that during writing, and also that the voltage applied to the bit line BL during erasing is lower than that during writing. FIGS. 1AA to 3B have illustrated examples in which the $n^+$ layers 2 and 3 are provided and the majority carriers for writing are holes. However, even when $p^+$ layers are provided instead of the $n^+$ layers and the majority carriers for writing are electrons, the power consumption during erasing is also lower than the power consumption during writing for similar reasons. However, since the value of a current becomes either positive or negative depending on its flow direction, the expression "high" or "low" may be inappropriate depending on circumstances. Thus, it would be more appropriate to say that "the absolute value of a current flowing through the bit line BL during a memory erase operation is lower than that during a memory write operation."

It should be noted that the voltage applied to the bit line, which allows a maximum electric field between the bit line and the source line to be greater than or equal to $10^4$ V/cm, would be sufficient for carriers to move by drifting. Therefore, even when the voltage applied to the bit line is higher or lower than 0.6 V indicated above, it is acceptable as long as a voltage that is sufficient to allow a drift of electrons to occur in the depletion layer 16 is applied to the bit line.

Further, an erase operation may be similarly performed by applying a voltage that is 1.5 times higher than the Vth-WL to the word line to form an inversion layer, and applying 0 V or a voltage lower than the Vth-PL to the plate line so as not to form an inversion layer.

Described heretofore is a case where the $n^+$ layers 2 and 3 are provided and the majority carriers for writing are holes. In contrast, when $p^+$ layers are provided instead of the $n^+$ layers and the majority carriers for writing are electrons, it would be appropriate to say that "0 V or a voltage higher than the Vth-PL is applied to the plate line." As described above, the expression of a threshold voltage that is "high" or "low" may be inappropriate depending on the type of the MOS transistor. Thus, it would be more appropriate to express a threshold voltage using "the absolute value of the threshold voltage and the polarity of the threshold voltage (i.e., positive or negative)." For example, using such an expression, it is possible to say that "a voltage that has an absolute value greater than or equal to the absolute value of the threshold voltage of the MOS transistor region and has the same polarity as the polarity of the threshold voltage is applied."

In the description of the present embodiment, the first gate conductor layer 5 that is adjacent to the $n^+$ layer 2 is connected to the word line WL, and the second gate conductor layer 7 that is adjacent to the n$^+$ layer 3 is connected to the plate line PL. In contrast, a memory erase operation of the present invention may also be performed by providing the second gate conductor layer 7 connected to the plate line PL at a position adjacent to the n$^+$ layer 2 and providing the first gate conductor layer 5 connected to the word line WL at a position adjacent to the n$^+$ layer 3.

As a method of erasing data other than that exemplarily described above, the conditions of the voltages applied to the bit line BL, the source line SL, the word line WL, and the plate line PL may be other combinations, such as 0.6 V (BL)/0 V (SL)/2 V (PL)/0 V (WL), 0 V (BL)/0.6 V (SL)/0 V (PL)/2 V (WL), 0.6 V (BL)/0 V (SL)/2 V (PL)/0.2 V (WL), and 1.5 V (BL)/0 V (SL)/2 V (PL)/0 V (WL). The foregoing conditions of the voltages applied to the bit line BL, the source line SL, the word line WL, and the plate line PL are only examples for performing a memory erase operation. Thus, any other operating voltage conditions that allow for a memory erase operation may be used.

When the PL-FET and the WL-FET are P-channel FETs, the p layer 1 is an n-type semiconductor, and the majority carriers are electrons, and also, the polarity of each of the potentials provided to the bit line, the word line, and the plate line, which is positive in the foregoing examples, is negative.

As described in the present embodiment, the present dynamic flash memory cell may have any structure that satisfies the condition that the holes 17 generated through an impact ionization phenomenon are retained in the p layer 1. To this end, it is acceptable as long as the p layer 1 has a floating body structure isolated from the substrate 20. Accordingly, the foregoing dynamic flash memory operation can be performed even when the p layer 1 is formed horizontally on the substrate 20 using the GAA (Gate All Around; for example, see E. Yoshida: "A Capacitorless 1T-DRAM Technology Using Gate-Induced Drain-Leakage (GIDL) Current for Low-Power and High-Speed Embedded Memory," IEEE IEDM (2006)) technology, which is one of SGTs, or the nanosheet technology (for example, see F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., Vol. E90-c., No. 4 pp. 765-771 (2007) and K. Sakui, N. Harada, "Dynamic Flash Memory with Dual Gate Surrounding Gate Transistor (SGT)," Proc. IEEE IMW, pp. 72-75 (2021)), for example. Alternatively, a device structure using SOI (Silicon On Insulator; for example, see J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012), Takashi Ohasawa and Takeshi Hamamoto, "Floating Body Cell-a Novel Body Capacitorless DRAM Cell", Pan Stanford Publishing (2011), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006), and E. Yoshida: "A Capacitorless 1T-DRAM Technology Using Gate-Induced Drain-Leakage (GIDL) Current for Low-Power and High-Speed Embedded Memory," IEEE IEDM (2006)) may also be used. In such a device structure, the bottom of the channel region is in contact with an insulating layer of a SOI substrate, and the channel region is surrounded by a gate insulating layer and element isolation insulating layers together with other channel regions. Even in such a structure, the channel region has a floating body structure. In this manner, it is acceptable as long as the dynamic flash memory element provided in the present embodiment satisfies the condition that its channel region has a floating body structure. Further, even with a structure in which a Fin transistor (for example, J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186-191, (2006)) is formed on a SOI substrate, the present dynamic flash memory operation can be performed as long as its channel region has a floating body structure.

The present embodiment has the following features.

(Feature 1)

According to the memory erase operation of the present embodiment, a memory erase operation can be performed with low power consumption. As illustrated in FIGS. 3A and 3B, the present invention is characterized in that during a period of a memory erase operation, the inversion layer 14b is formed in the p layer 1 of the PL-FET so as to be continuous with the n$^+$ layer 3. When data is retained in the memory, the area in which holes stored in the memory cell recombine with electrons is determined by the portion where the n$^+$ layer 3 and the p layer 1 are in contact with each other. In contrast, when data is erased from the memory, the area in which holes and electrons recombine can be increased than that when data is retained in the memory, thus increasing chances for recombination of electrons and holes because the entire inversion layer 14b formed immediately below the gate insulating layer 6 is electrically connected to the n$^+$ layer 3. Further, since the WL-FET is not on at this time, no current flows from the bit line BL to the source line SL, and thus, impact ionization that would disturb the erase operation does not occur in the p layer 1. This contributes to performing a stable memory operation in addition to the reliable memory erase operation. Further, in the present memory erase operation, only the necessary amount of electrons is injected from the source line SL to make up for the loss of electrons due to the recombination of electrons and holes. Thus, there is only a very small current flow, and the memory erase operation can be performed with low power consumption.

(Feature 2)

In the present embodiment, a memory erase operation can be performed with low power consumption. Thus, each of the PL-FET and the WL-FET (when operating as an N-channel MOS transistor) may operate at a positive potential or 0 V without requiring a negative potential during the entire operation. This can simplify the peripheral detection circuit and the drive circuit, and reduce the overall size of the device.

(Feature 3)

In the dynamic flash memory according to the first embodiment of the present invention, there is no need to apply a voltage with opposite polarity to each of the source line SL, the word line WL, the plate line PL, and the bit line BL during a memory erase operation. This can prevent a decrease in the reliability of the gate oxide film of the PL-FET that would otherwise occur when a large electric field is applied to the oxide film.

The present invention can be implemented in various embodiments and modifications without departing from the broad spirit and scope of the present invention. In addition, each of the foregoing embodiments only describes an example of the present invention and is not intended to limit the scope of the present invention. The foregoing examples and modified examples may be combined as appropriate. Further, even if some of the components of the foregoing embodiments are removed as needed, the resulting structure is within the technical idea of the present invention.

With the semiconductor elements according to the present invention, it is possible to provide a semiconductor memory device with higher density, higher operation speed, and higher operation margin than those of the conventional devices.

What is claimed is:

1. A memory device with semiconductor elements, comprising:
   a semiconductor base material extending on a substrate in a horizontal direction or a vertical direction;
   a first impurity region and a second impurity region that are continuous with respective opposite ends of the semiconductor base material;
   a first gate insulating layer partially covering the semiconductor base material;
   a first gate conductor layer covering the first gate insulating layer;
   a second gate insulating layer continuous with the first gate insulating layer and partially covering the semiconductor base material; and
   a second gate conductor layer not in contact with the first gate conductor layer, the second gate conductor layer covering the second gate insulating layer,
   wherein a memory erase operation is performed by applying to one of the first gate conductor layer and the second gate conductor layer a first voltage in a range of 0 V to a threshold voltage, and also applying to the other of the first gate conductor layer and the second gate conductor layer a second voltage having a polarity identical to a polarity of the first voltage and having an absolute value greater than or equal to an absolute value of the threshold voltage, thereby reducing holes or electrons that are majority carriers remaining in the semiconductor base material.

2. The memory device with the semiconductor elements according to claim 1,
   wherein the first impurity region is connected to a source line, the second impurity region is connected to a bit line, one of the first gate conductor layer and the second gate conductor layer is connected to a word line, and the other of the first gate conductor layer and the second gate conductor layer is connected to a plate line, and
   an operation of a dynamic flash memory is performed by applying a voltage to each of the source line, the bit line, the plate line, and the word line to execute a memory write operation, a memory read operation, and the memory erase operation.

3. The memory device with the semiconductor elements according to claim 2,
   wherein in the erase operation for the dynamic flash memory, when the majority carriers in the semiconductor base material are holes, a voltage of 0 V or a positive potential is applied to the first impurity region, the second impurity region, the first gate conductor layer, and the second gate conductor layer.

4. The memory device with the semiconductor elements according to claim 2,
   wherein in the erase operation for the dynamic flash memory, when the majority carriers in the semiconductor base material are electrons, a voltage of 0 V or a negative potential is applied to the first impurity region, the second impurity region, the first gate conductor layer, and the second gate conductor layer.

5. The memory device with the semiconductor elements according to claim 2,
   wherein in the memory erase operation for the dynamic flash memory, one of the source line and the bit line is at 0 V.

6. The memory device with the semiconductor elements according to claim 2,
   wherein the memory write operation for the dynamic flash memory includes
   applying to the word line a voltage having an absolute value that is greater than or equal to an absolute value of a threshold voltage of a first MOS transistor region including the first gate insulating layer and the first gate conductor layer, and having a polarity identical to a polarity of the threshold voltage,
   applying to the plate line a voltage having an absolute value that is greater than or equal to an absolute value of a threshold voltage of a second MOS transistor region including the second gate insulating layer and the second gate conductor layer, and having a polarity identical to a polarity of the threshold voltage,
   applying to the bit line a voltage that allows a maximum electric field in the semiconductor base material to cause impact ionization during writing,
   applying 0 V to the source line, thereby causing an impact ionization phenomenon based on a current flowed between the first impurity region and the second impurity region, and thus generating electrons and holes in the semiconductor base material and the first impurity region, and
   allowing, among the generated electrons and holes, some or all of the electrons or the holes that are the majority carriers in the semiconductor base material to remain in the semiconductor base material.

7. The memory device with the semiconductor elements according to claim 2,
   wherein an absolute value of a current flowing through the bit line during the memory erase operation for the dynamic flash memory is lower than an absolute value of a current flowing through the bit line during the memory write operation for the dynamic flash memory.

8. The memory device with the semiconductor elements according to claim 2,
   wherein the voltages applied to the plate line, the word line, the source line, and the bit line during the memory write operation and the memory erase operation for the dynamic flash memory are 0 V or voltages having the same polarity.

* * * * *